United States Patent
Day

(10) Patent No.: US 9,632,142 B2
(45) Date of Patent: Apr. 25, 2017

(54) SOLENOID TRANSIENT VARIABLE RESISTANCE FEEDBACK FOR EFFECTER POSITION DETECTION

(71) Applicant: PRATT & WHITNEY CANADA CORP., Longueuil (CA)

(72) Inventor: Christopher Bryan Day, Mississauga (CA)

(73) Assignee: PRATT & WHITNEY CANADA CORP., Longueuil (CA)

( * ) Notice: Subject to any disclaimer, the term of this patent is extended or adjusted under 35 U.S.C. 154(b) by 0 days.

(21) Appl. No.: 14/990,537

(22) Filed: Jan. 7, 2016

(65) Prior Publication Data

US 2016/0116537 A1 Apr. 28, 2016

Related U.S. Application Data

(63) Continuation of application No. 13/554,134, filed on Jul. 20, 2012, now Pat. No. 9,274,176.

(51) Int. Cl.
| | |
|---|---|
| *F02P 17/00* | (2006.01) |
| *G01R 31/00* | (2006.01) |
| *G01R 31/327* | (2006.01) |
| *H01H 47/00* | (2006.01) |

(52) U.S. Cl.
CPC ....... *G01R 31/3278* (2013.01); *H01H 47/002* (2013.01)

(58) Field of Classification Search
CPC .......................... G01R 31/3278; H01H 47/002
See application file for complete search history.

(56) References Cited

U.S. PATENT DOCUMENTS

| | | |
|---|---|---|
| 4,205,307 A | 5/1980 | Liermann et al. |
| 4,387,306 A | 6/1983 | Sibley |
| 4,851,959 A | 7/1989 | Stumpf |
| 4,905,121 A | 2/1990 | Uetsuhara et al. |
| 4,967,309 A | 10/1990 | Hoffman |
| 5,074,053 A | 12/1991 | West |
| 5,079,502 A | 1/1992 | Rogacki et al. |
| 5,196,983 A | 3/1993 | Stumpf |
| 5,204,633 A | 4/1993 | Ahladas et al. |
| 5,442,865 A | 8/1995 | Wallrafen |
| 5,574,366 A | 11/1996 | Joost |
| 6,191,575 B1 | 2/2001 | Mednikov et al. |
| 6,208,497 B1 | 3/2001 | Seale et al. |
| 7,099,136 B2 | 8/2006 | Seale et al. |
| 7,528,597 B2 | 5/2009 | Taylor et al. |
| 7,876,109 B2 | 1/2011 | Mohr et al. |
| 2004/0012380 A1* | 1/2004 | Vincent .................... B60T 8/36 324/117 R |
| 2011/0115511 A1* | 5/2011 | Finlay, Sr. ............. H01H 83/04 324/750.3 |

* cited by examiner

*Primary Examiner* — Farhana Hoque
(74) *Attorney, Agent, or Firm* — Norton Rose Fulbright Canada LLP

(57) ABSTRACT

Feedback from a solenoid is achieved by adding at least one variable resistance in parallel with the solenoid current feedback circuit for position detection. The resistance has current flowing therethrough when a switching device actuated by the solenoid is in one position or transitions from one position to at least one other position. A feedback current may be measured in the current feedback circuit and the position of the switching device in response to actuation thereof by the solenoid may be determined from the measured feedback current.

19 Claims, 9 Drawing Sheets

US 9,632,142 B2

SOLENOID TRANSIENT VARIABLE RESISTANCE FEEDBACK FOR EFFECTER POSITION DETECTION

CROSS-REFERENCE TO RELATED APPLICATIONS

The present application is a continuation of U.S. patent application Ser. No. 13/554,134, filed on Jul. 20, 2012, the contents of which are hereby incorporated by reference in their entirety.

TECHNICAL FIELD

The application relates generally to a system and method for detecting the position of a switching device actuated by a solenoid.

BACKGROUND OF THE ART

Solenoids may be used to actuate switching devices in a variety of applications, such as fuel transmission systems or vehicle brake systems. As the response of the switching device to the actuation command of the solenoid may be of primary importance for a given application, it is desirable to monitor the operation of the solenoid and of the switching device. For this purpose, a variety of external sensing devices may be used to detect electrical or mechanical faults preventing operation of the solenoid or to provide feedback as to whether the switching device has operated as commanded by the solenoid. However, the use of such devices typically increases the weight, complexity and cost of the overall system.

There is therefore a need for an improved system and method for detecting the position of a switching device actuated by a solenoid.

SUMMARY

In one aspect, there is provided a switching device position detection system comprising a solenoid adapted to generate mechanical energy from an energizing current supplied thereto; a switching device coupled to the solenoid and adapted to be driven by the mechanical energy to move between a first position and at least one second position; at least one measuring element coupled to the switching device, the at least one measuring element adapted to be engaged by the switching device and to have a measuring current flowing therethrough when the switching device moves to the at least one second position; and a solenoid driver coupled to the solenoid and to the at least one measuring element and adapted to supply the energizing current to the solenoid and to detect the measuring current to determine whether the switching device has moved to the at least one second position.

In another aspect, there is provided a switching device position detection method comprising energizing a solenoid by supplying an energizing current from a solenoid driver coupled thereto, thereby actuating a switching device coupled to the solenoid to move between a first position and at least one second position; generating a measuring current through at least one measuring element coupled to the switching device when the switching device moves between the first position and the at least one second position; and detecting the measuring current at the solenoid driver to determine whether the switching device has moved to the at least one second position.

In a further aspect, there is provided a switching device position detection system comprising means for energizing a solenoid by supplying an energizing current from a solenoid driver coupled thereto, thereby actuating a switching device coupled to the solenoid to move between a first position and at least one second position; means for generating a measuring current through at least one measuring element coupled to the switching device when the switching device moves between the first position and the at least one second position; and means for detecting the measuring current at the solenoid driver to determine whether the switching device has moved to the at least one second position; and means for determining whether the switching device has moved to the at least one second position.

DESCRIPTION OF THE DRAWINGS

Reference is now made to the accompanying figures in which:

FIG. 3 is a schematic diagram of an exemplary embodiment of the solenoid driver of FIG. 2a;

DETAILED DESCRIPTION

Figure 1:
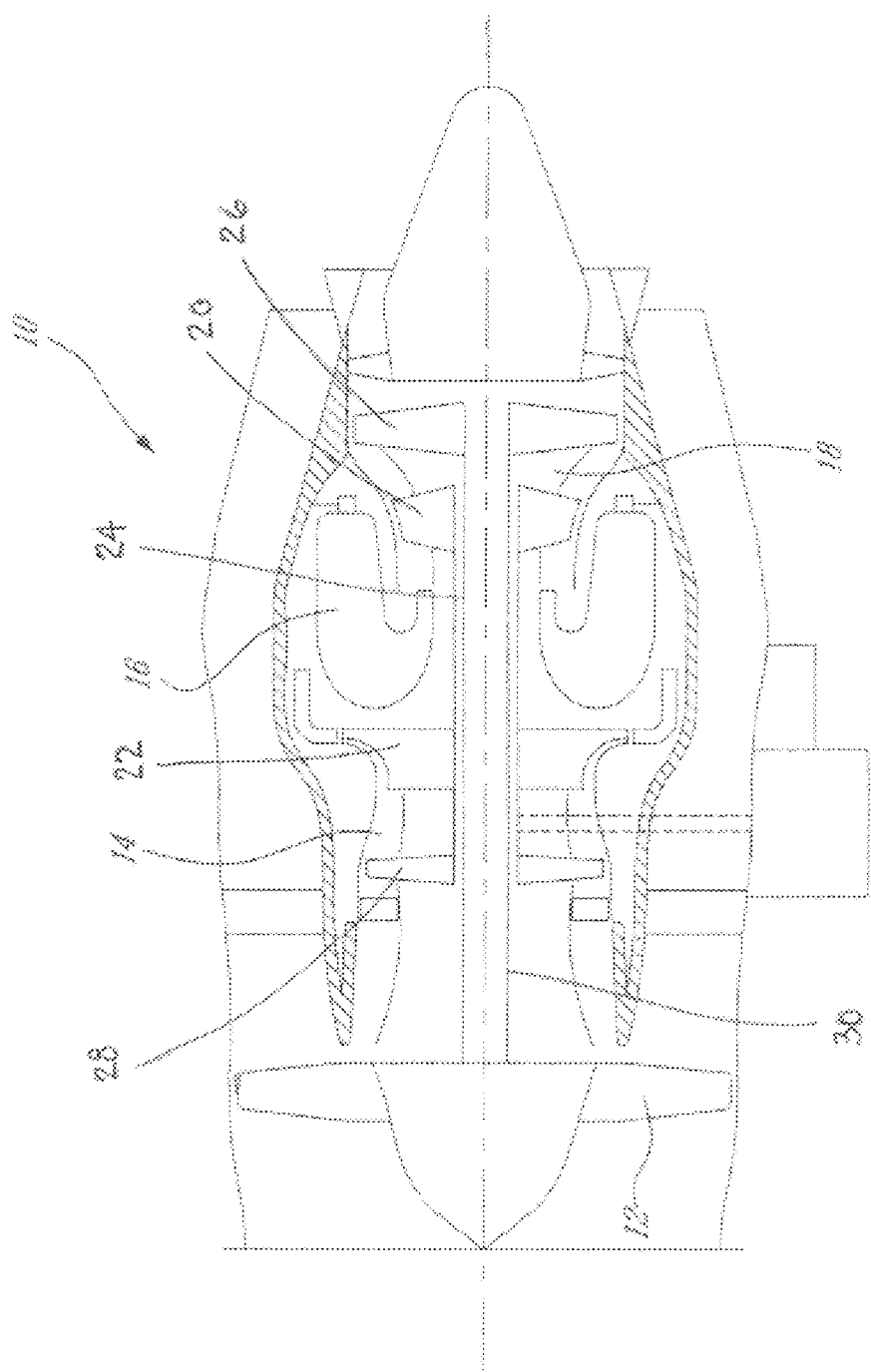
FIG. 1 is a schematic side cross-sectional view of a gas turbine engine.

FIG. 1 illustrates a gas turbine engine 10 of a type typically provided for use in subsonic flight, generally comprising in serial flow communication a fan 12 through which ambient air is propelled, a compressor section 14 for pressurizing the air, a combustor 16 in which the compressed air is mixed with fuel and ignited for generating an annular stream of hot combustion gases, and a turbine section 18 for extracting energy from the combustion gases. High pressure rotor(s) 20 of the turbine section 18 are drivingly engaged to high pressure rotor(s) 22 of the compressor section 14 through a high pressure shaft 24. Low pressure rotor(s) 26 of the turbine section 18 are drivingly engaged to the fan rotor 12 and to other low pressure rotor(s) 28 of the compressor section 14 through a low pressure shaft 30 extending within the high pressure shaft 24 and rotating independently therefrom.

Figure 2A:
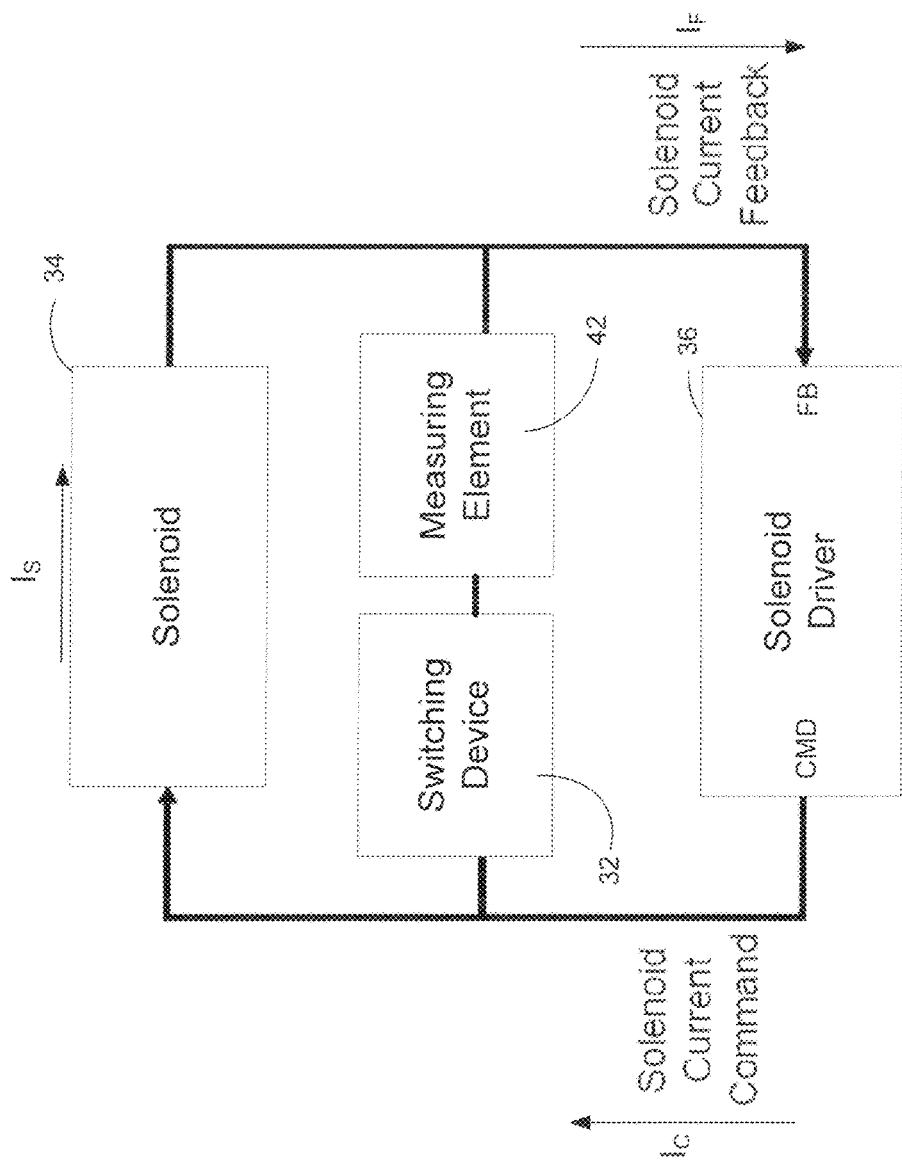
FIG. 2a is a schematic diagram of a switching device position detection system in accordance with a first illustrative embodiment.
Figure 2B:
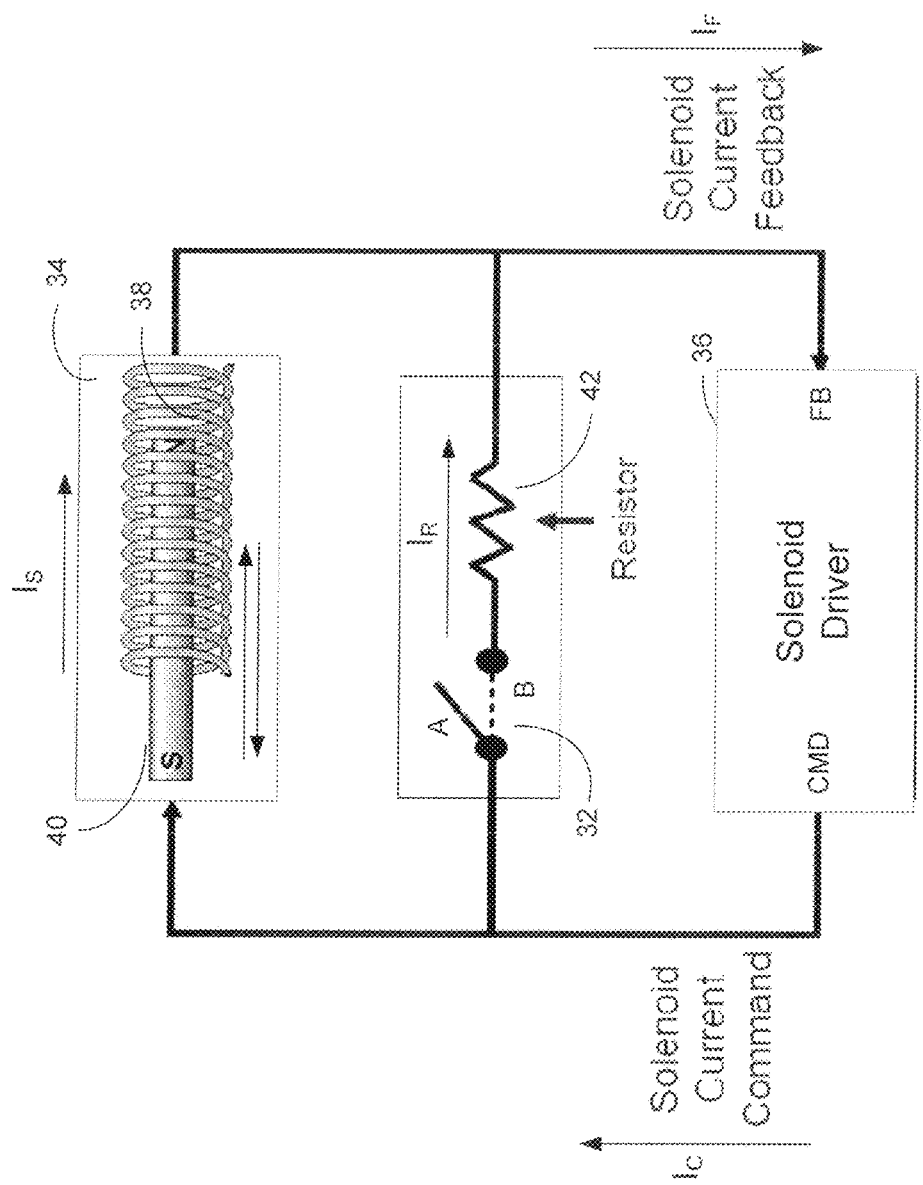
FIG. 2b is a schematic diagram of the switching device position detection system of FIG. 2a comprising a switch and a resistor.

Referring to FIG. 2a and FIG. 2b, the engine 10 may comprise a plurality of switching devices 32, such as two-way switching valves, bypass valves, proportional valves, switches, or the like, used for controlling an operation thereof. For example, such switching devices 32 may include valves (not shown) used as part of a fuel system for enabling fuel, such as diesel oil pressurized by a suitable pump, to flow into the engine 10. During the starting of the gas turbine engine 10, the valve may be opened so that a portion of the fuel may flow through a starter manifold to combustion equipment (not shown) for the initiation of combustion. As soon as combustion has been initiated and sustained, the valve may be closed so that all the fuel may pass through a main manifold to burners. Still, it should be understood that the switching devices 32 may be used in applications other than fuel control systems, such as in engine health monitoring systems.

The switching device 32 may be driven by a solenoid 34 coupled to a solenoid driver 36, such as a microprocessor having preprogrammed logic (not shown). As illustrated in FIG. 2b, the solenoid 34 may comprise a coil 38 wrapped around a movable plunger 40 normally occupying a first physical position and displaced to a second physical position when the coil 38 is energized. For this purpose, the solenoid driver 36, which may be coupled to a power source (not shown), may generate a current command $I_C$ and send the current command $I_C$ to the solenoid 34 for supplying electrical energy to the coil 38. As a result, a current $I_S$ may flow through the solenoid 34, thereby energizing the coil 38 and generating mechanical energy to displace the plunger 40 from the first position to the second position. The solenoid driver 36 may use a variety of methods for directing the current command $I_C$ to the solenoid 34. For example, a constant electrical current may be turned on or off according to a desired position to be achieved by the solenoid 34. A pulse width modulation electrical current may also be used, with the pulse width modulations being set at a predetermined frequency so that the solenoid 34 may be activated and deactivated at desired time periods.

The movable plunger 40 of the solenoid 34 is illustratively connected to contacts of the switching device 32, such that the movement of the movable plunger 40 through the coil 38 actuates the switching device 32. When actuated, the switching device 32 may then move between at least a first, e.g. open, position A and a second, e.g. closed, position B. More positions may be provided depending on whether the switching device 32 is a single-position or a multi-position switching device, as will be discussed below.

A current feedback $I_F$, equal to the sum of the current $I_S$ flowing through the solenoid 34 and the current, if any, flowing through the switching device 32, may be measured by a suitable sensor (not shown) and received at the solenoid driver 36 for monitoring the state of the solenoid 34 and of the switching device 32. On the basis of the value of such a current feedback $I_F$, the solenoid driver 40 may adjust the magnitude of a new solenoid current command $I_C$ generated to sustain the energization of the coil 38 or alternatively de-energize the coil 38 if a desired operation, e.g. opening or closing of the switching device 32, has been fully achieved. For instance, the solenoid driver 36 may measure the current feedback $I_F$ and compare the current feedback $I_F$ to a threshold predetermined according to the physical characteristics of the solenoid 34 and the switching device 32. If the current feedback $I_F$ is below the threshold, the solenoid driver 36 may generate a current command $I_C$ that keeps the coil 38 energized. In this manner, the current $I_S$ flowing through the solenoid 34, and thereby the operation of the solenoid 34, may be regulated in a closed loop fashion by the solenoid driver 36.

In order to monitor the operation of the switching device 32 and therefore detect potential faults, a sensing or measuring element 42, such as a resistor as illustrated in FIG. 2b, may be placed in parallel with the solenoid current feedback circuit comprising the solenoid 34 and the solenoid driver 36. It should be understood that although the description refers to a resistor 42, any other suitable measuring element known to those skilled in the art may be coupled to the switching device 32 to monitor a position thereof. When the switching device 32 is in the first, i.e. open, position A, no current may flow therethrough and the current feedback $I_F$ entering the solenoid driver 36 equals the current $I_S$ flowing through the solenoid 34, with the current $I_S$ flowing through the solenoid 34 being illustratively equal to the current command $I_C$ previously sent by the solenoid driver 36 to the solenoid 34 to actuate the solenoid 34. Measurements made while the switching device 32 is in position A correspond to time $t=t_1$. When the switching device 32 moves to the second, i.e. closed, position B shown in dotted line, the switching device 32 engages the resistor 42. This results in a current $I_R$ flowing through the resistor 42 as long as the switching device 32 remains in the second position B, and thus in an increase in the solenoid current feedback $I_F$ at a time $t=t_2$ compared to the previously measured $I_F$ at time $t=t_1$.

Figure 3:
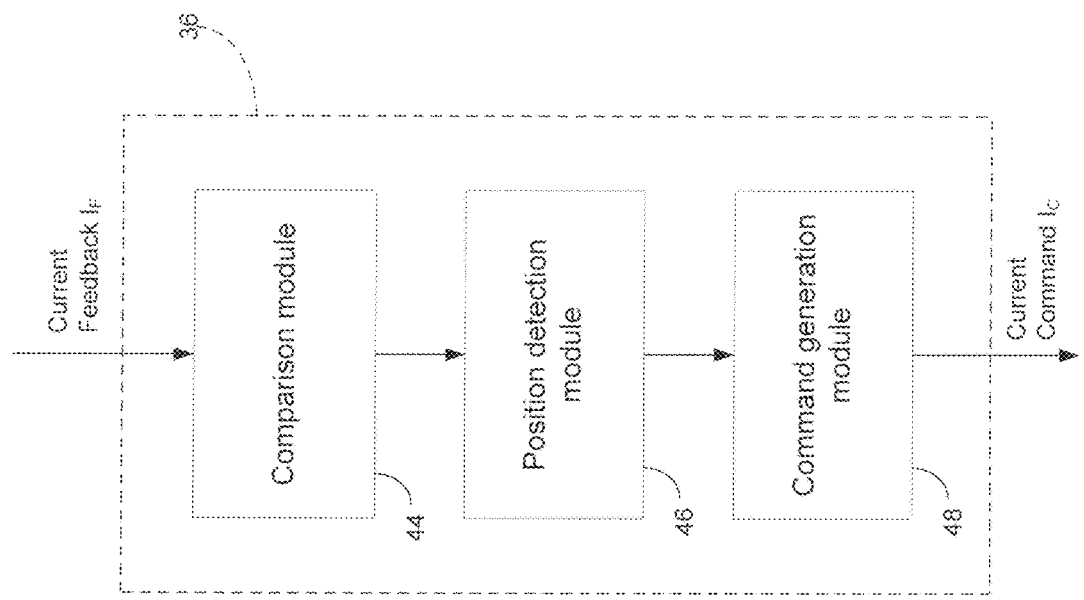

Referring to FIG. 3, the current increase $I_R$ may be detected by the solenoid driver 36, which monitors the current feedback $I_F$. For this purpose, the solenoid driver 36 may comprise a comparison module 44, a position detection module 46, and a command generation module 48. The comparison module 44 is illustratively adapted to receive the reading of the current feedback $I_F$ and compare the reading to the predetermined threshold, such as the current command $I_C$ at time $t=t_1$. The result of the comparison may then be sent to the position detection module 46, which may be adapted to determine the position of the switching device 32 according to the comparison. Indeed, if the received reading of the current feedback $I_F$ at time $t=t_2$ is equal to the previously issued current command $I_C$ at time $t=t_1$, the solenoid driver 36 may determine that the switching device 32 is in the first position A. Alternatively, if the reading at time $t=t_2$ is greater than the previously issued current command $I_C$ at time $t=t_1$ by a value equal to the value of the current increase $I_R$, which may be retrieved from a database (not shown) coupled to the solenoid driver 36, the current increase $I_R$ may be detected. The resistive value of the resistor 42 may indeed be stored in the database and retrieved by the solenoid driver 36 to determine a corresponding value of the current increase $I_R$. As a result, the solenoid driver 36 may detect that the switching device 32 has moved to the second position B.

The position detection module 46 may then send the position estimate to the command generation module 48, which may generate a new current command $I_C$ to be sent to the solenoid 34 for controlling a movement of the plunger 40 relatively to the coil 38 and therefore adjust a position of the switching device 32. For example, if the position estimate indicates that the switching device 32 is in position A while it is desired to move the switching device 32 to position B, the value of the current command $I_C$ may be adjusted accordingly so that the solenoid 34 may remain energized and further actuate the switching device 32 to the desired position.

Figure 4:
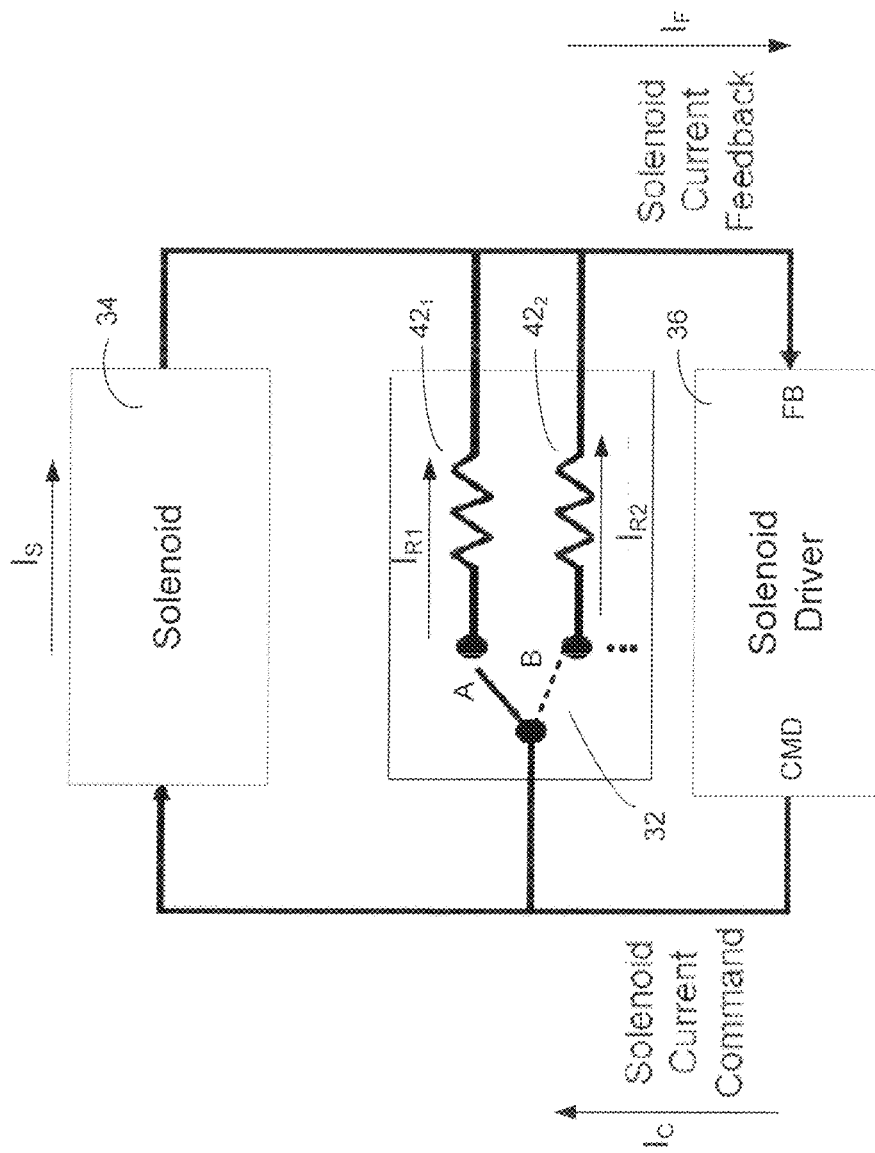
FIG. 4 is a schematic diagram of a position detection system for a multi-position switching device in accordance with a second illustrative embodiment.

Referring to FIG. 4, according to an alternate embodiment, the switching device 32 may be adapted to move among a plurality of closed positions, e.g. two positions A, B. Accordingly, a plurality of resistors, e.g. two resistors $42_1$, $42_2$, having different resistive values may be provided in the solenoid current feedback circuit, with each resistor $42_1$, $42_2$ adapted to be engaged by the switching device 32 when the switching device 32 is in a given closed position A, B. For example, the switching device 32 may be adapted to move between a first closed position A and a second closed position B and, as such, a first resistor $42_1$ and a second resistor $42_2$ may be respectively provided for each position A, B. In this manner, when in the position A, the multi-position switching device 32 may engage the first resistor $42_1$, thus leading to a current $I_R$, flowing therethrough as long as the switching device 32 remains in position A. When the multi-position switching device 32 moves to the position B, the resistor $42_2$ may be engaged, thus leading to a current $I_{R2}$ flowing therethrough as long as the switching device 32 remains in position B. The current $I_{R1}$ or $I_{R2}$ flowing through either resistor $42_1$ or $42_2$ engaged by the switching device 32 may then add to the current $I_S$ (equal to the previously issued current command $I_C$) flowing through the solenoid 34 to form the current feedback $I_F$ sent to the solenoid driver 36.

In order to identify the resistor $42_1$ or $42_2$, which has been engaged by the switching device 32, and accordingly the position thereof, the current increase $I_{R1}$, or $I_{R2}$ may be detected by the solenoid driver 36 using the comparison module 44 to compare the reading of the current feedback $I_F$ at time $t=t_2$ to the previously issued current command $I_C$ at time $t=t_1$. In particular, if the result of the comparison indicates that the current feedback $I_F$ at time $t=t_2$ is greater than the previously issued current command $I_C$ at time $t=t_1$ by a value of $I_{R1}$, the position detection module 46 may determine that the resistor $42_1$ has been engaged by the switching device 32 and that the switching device 32 is therefore in position A. If the result of the comparison indicates that the current feedback $I_F$ at time $t=t_2$ is greater than the previously issued current command $I_C$ at time $t=t_1$ by a value of $I_{R2}$, the position detection module 46 may identify that the resistor $42_2$ has been engaged by the switching device 32 and that the switching device 32 is therefore in position B. If no resistor $42_1$ or $42_2$ has been engaged, no current increase $I_{R1}$ or $I_{R2}$ will illustratively be detected and the position of the switching device 32, i.e. the open position (not shown), will be determined accordingly.

Figure 5:
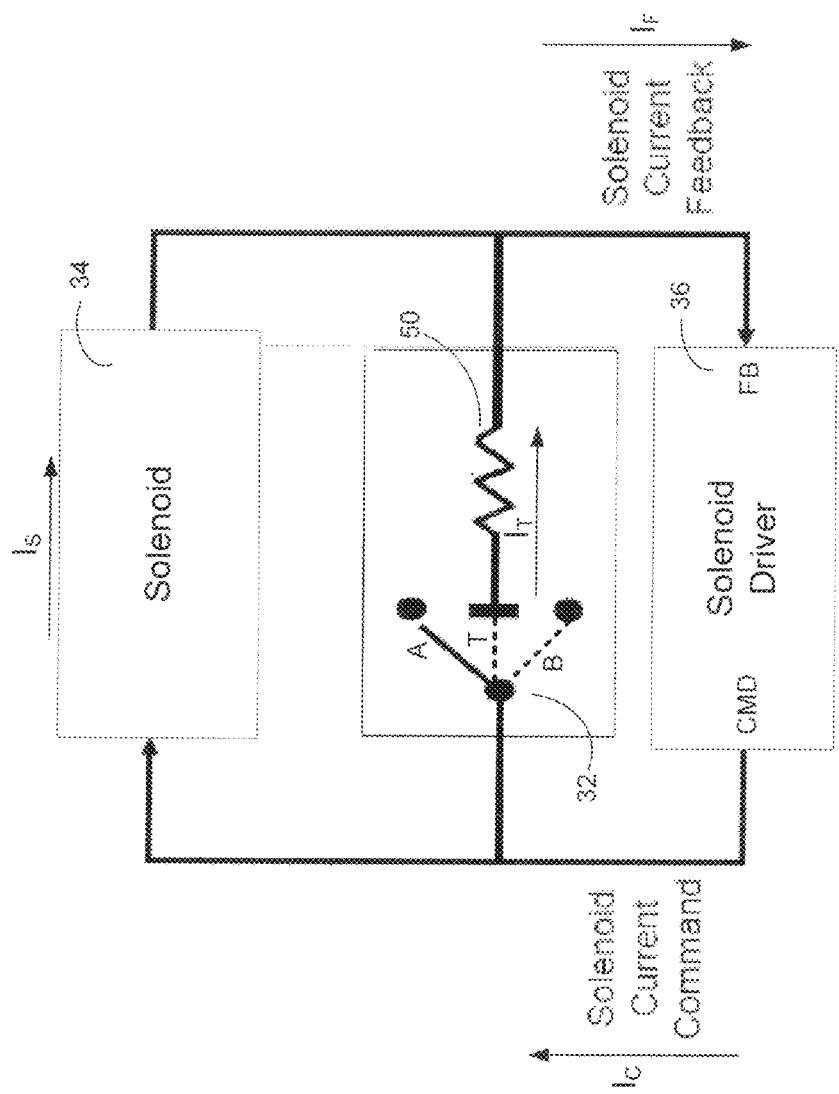
FIG. 5 is a schematic diagram of a position detection system for a multi-position switching device adapted to pass through a transient position in accordance with a third illustrative embodiment.

Referring to FIG. 5, according to an alternative embodiment, the switching device 32 may be adapted to pass through a transient position T when moving between a first steady state position A and a second steady state position B. Accordingly, a resistor 50 may be coupled to the switching device 32 and adapted to be temporarily engaged by the switching device 32 when the switching device 32 passes through the transient position T. When the resistor 50 is engaged, a current $I_T$ may flow through the resistor 50, resulting in a momentary current spike in the current feedback $I_F$ monitored by the solenoid driver 36. Thus, the solenoid driver 36 may identify the current spike $I_T$ as being representative of the switching device 32 transitioning from the first position A to the second position B, and vice versa. According to the monitored current feedback $I_F$, the solenoid driver 36 may therefore determine the position of the switching device 32.

Figure 6:
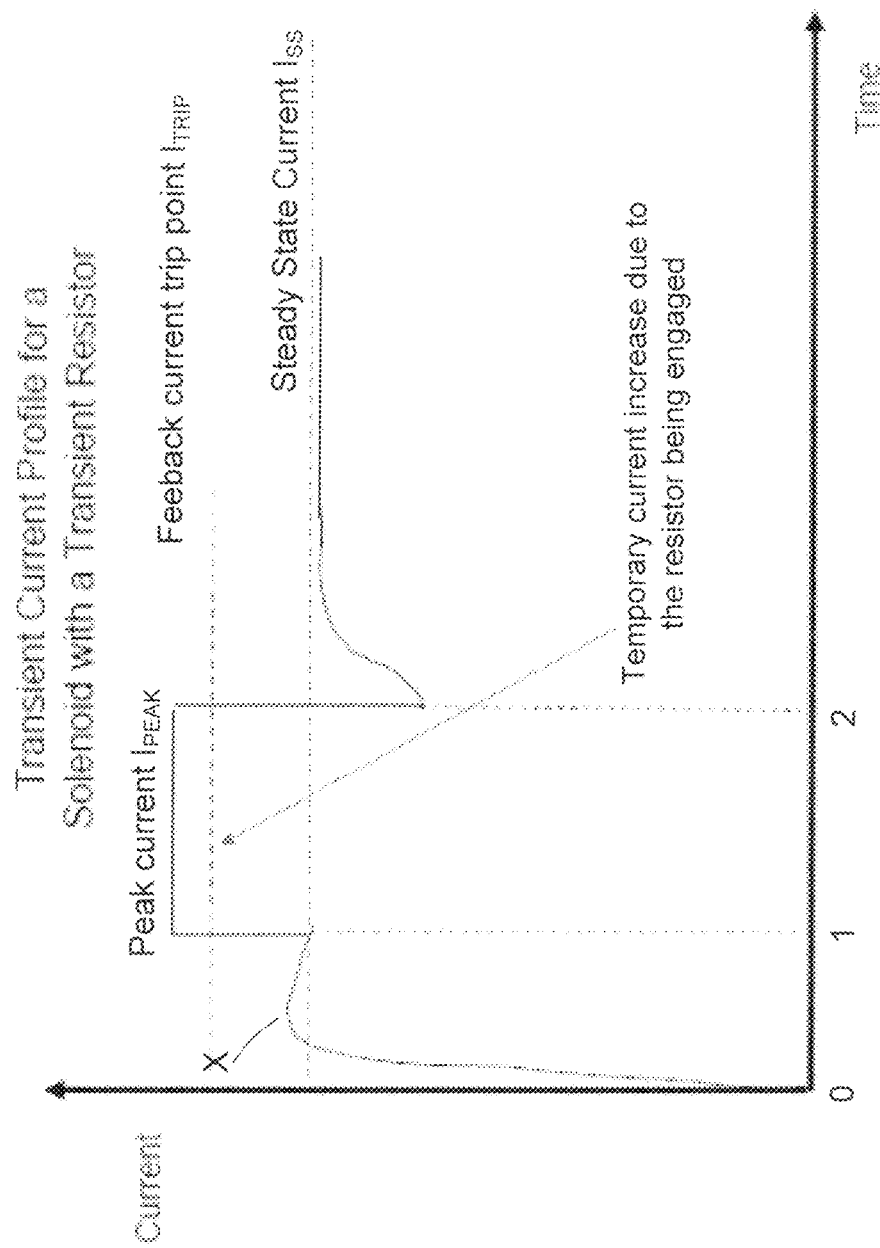
FIG. 6 is a graph of an exemplary transient current profile of the solenoid of FIG. 5.

FIG. 6 shows the transient current profile of the current feedback $I_F$ versus time as the solenoid 34 moves between steady state positions A and B. At time 0, the solenoid 34 is illustratively energized. From time 0 to time 1, the current profile thus increases until a steady state current $I_{SS}$ is reached when the switching device is in steady state position A. An inflection point X may occur in the current profile due to a back electro-motive force generated by the movement of the plunger 40 through the coil 38. At time 1, the switching device 32 may move from position A to position B by passing through the transient position T, in which the resistor 50 is temporarily engaged. As a result, the current spike $I_T$ occurs and the current feedback $I_F$ reaches a peak value $I_{PEAK}$. At time 2, the switching device 32 may move out of the transient position T towards the steady state position B. The resistor 50 is therefore no longer engaged and the current feedback $I_F$ decreases to eventually reach the steady state value $I_{SS}$ when the switching device 32 is in steady state position B.

In this embodiment, the solenoid driver 36 may receive at the comparison module 44 a reading of the current feedback $I_F$ and identify a momentary peak current $I_{PEAK}$ during the transition of the solenoid 34 from position A to position B, or vice versa. The comparison module 44 may then compare the peak current $I_{PEAK}$ to a predetermined threshold or current feedback trip point $I_{TRIP}$. The current feedback trip point $I_{TRIP}$ may be set to a value greater than the value of the current command $I_C$ in order to take into account the increase in resistance, and in turn the increase in current $I_S$ flowing through the solenoid 34, as the solenoid 34 ages regardless of the current command $I_C$ supplied thereto. If the peak current $I_{PEAK}$ is equal to or greater than the current feedback trip point $I_{TRIP}$, the comparison module 44 may determine that the current spike $I_T$ has occurred and the position detection module 46 may identify, on the basis of the comparison, that the switching device 32 has successfully moved positions. Otherwise, it may be determined that no current spike has occurred and that the switching device 32 has not moved positions despite a current command $I_C$ having been previously sent by the command generation module 48 to the solenoid 34 for energizing the solenoid 34. The position detection module 46 may therefore identify that a fault has occurred.

Figure 7:
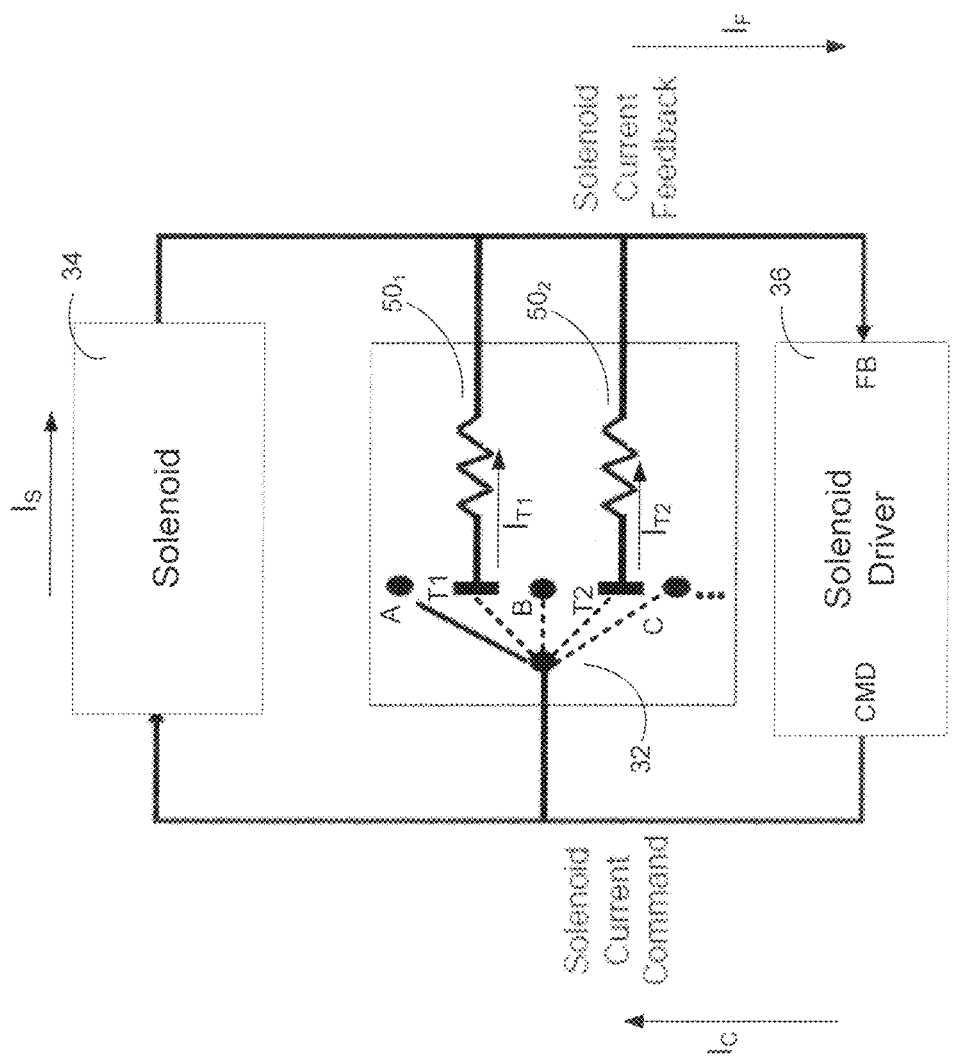
FIG. 7 is a schematic diagram of a position detection system for a multi-position switching device adapted to pass through a plurality of transient positions in accordance with a fourth illustrative embodiment.

Referring to FIG. 7, the switching device 32 may be adapted to move among a plurality of steady state positions, as in A, B, and C, by passing through one of a plurality of transient positions, as in T1 and T2, when transitioning between a pair of the steady state positions. As such, a plurality of resistors, as in $50_1$, $50_2$, having different resistive values may be coupled to the transient positions T1, T2 and each adapted to be engaged by the switching device 32 when the switching device 32 passes through the corresponding transient position T1 or T2. For example, if the switching device 32 moves from the first steady state position A to the second steady state position B, the switching device 32 may pass through the first transient position T1 and temporarily engage the first resistor $50_1$. As a result, a first current spike $I_{T1}$ may occur. At this point, the first expected value of the current feedback $I_F$ is illustratively equal to the sum of the solenoid current $I_S$, which is also equal to the previously issued current command $I_C$, and the first current spike $I_{T1}$. When the switching device 32 moves from the second steady state position B to the third steady state position C and passes through the second transient position T2, the switching device 32 may temporarily engage the second resistor $50_2$, thus resulting in a second current spike $I_{T2}$. In this case, the second expected value of the current feedback $I_F$ is equal to the sum of the previously issued current command $I_C$ and the second current spike $I_{T2}$.

At any point during the transition of the switching device 32 from one position A, B, C to the next, the comparison module 44 may receive a reading of the current feedback $I_F$ and identify the peak value $I_{PEAK}$ of the current feedback $I_F$. The comparison module 44 may then correlate the peak value $I_{PEAK}$ to the expected value of the current feedback $I_F$.

For instance, the comparison module 44 may determine that the peak value $I_{PEAK}$ is lower than either the first or the second expected value of the current feedback $I_F$ described above. The position detection module 46 may therefore identify that the switching device 32 has not passed through either transient position T1 or T2. In particular, assuming that the resistive value of the resistors 50$_1$, 50$_2$ is selected such that the first current spike $I_{T1}$ is smaller than the second current spike $I_{T2}$, if the peak value $I_{PEAK}$ is smaller than the first expected value of the current feedback $I_F$, the position detection module 46 may detect that the switching device has not passed through transient position T1 and is therefore still in position A. If the peak value $I_{PEAK}$ is equal to or greater than the first expected value yet smaller than the second expected value, the position detection module 46 may identify that the switching device 32 has passed through the first transient position T1 but not through the second transient position T2 and is therefore in position B. If the peak value $I_{PEAK}$ is equal to or greater than the second expected value, the position detection module 46 may identify that the switching device 32 has passed through the second transient position T2 and is therefore in position C. Adjusting the resistive value of the resistors 50$_1$, 50$_2$ may allow to vary the current ranges used to determine the physical position of the driven switching device 32.

Feedback of the position of the switching device 32, and accordingly fault detection, may therefore be provided using the driving circuit of the solenoid 34 and without the need for discrete inputs to be received from an external sensing device, such as a discrete switch, temperature sensor, pressure sensor, Linear Variable Differential Transformer (LVDT), or the like, which may be coupled to the switching device 32. In addition, when the switching device 32 is in steady state operation, e.g. in position A, B, or C of FIG. 6, no added power consumption illustratively results from the presence of the resistors 50$_1$, 50$_2$ in the current feedback circuit. Thus, it may be possible to determine whether the switching device 32 has operated in response to the movement of the solenoid 34 using circuitry having reduced weight, cost, and complexity.

Figure 8:
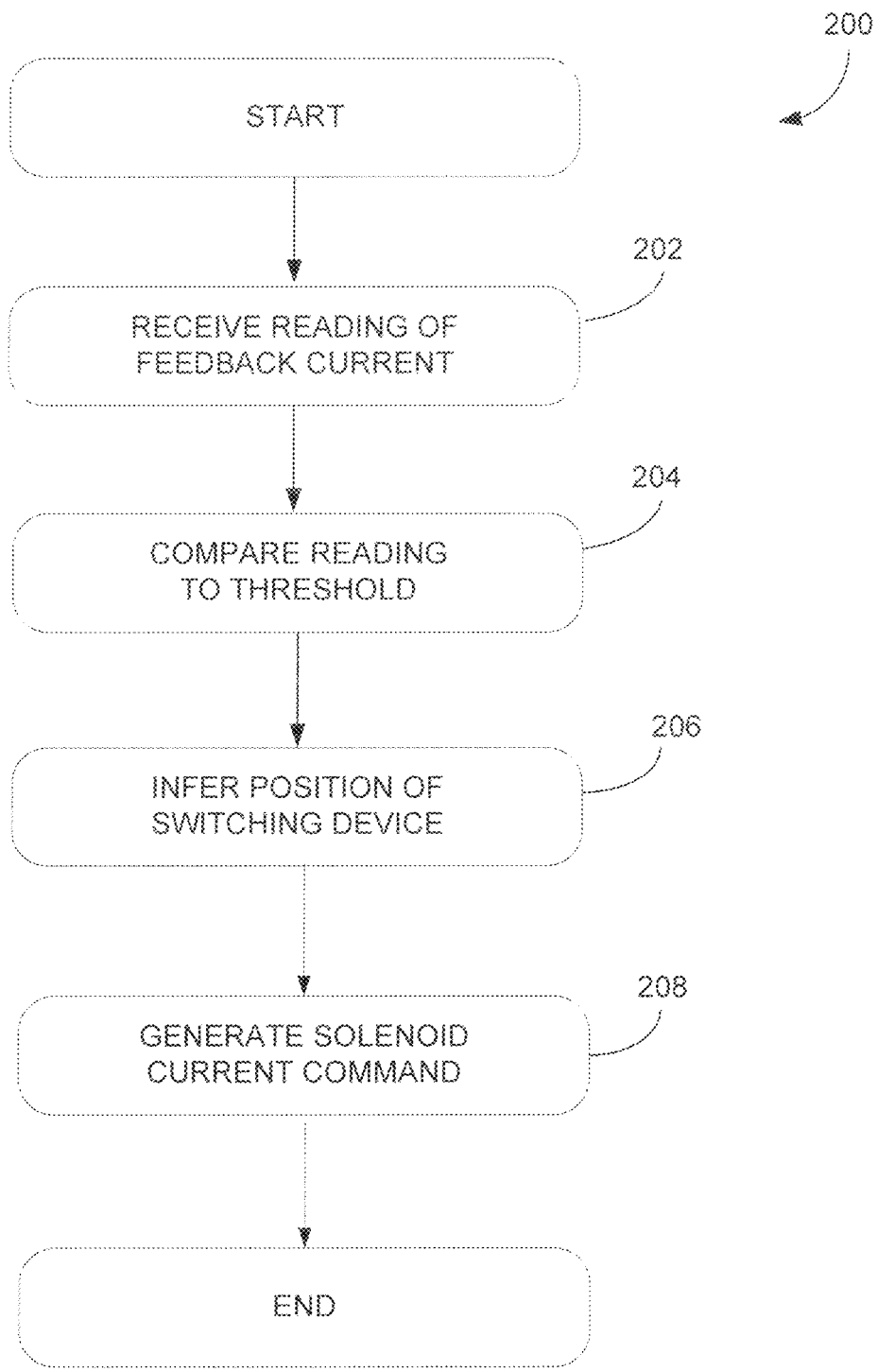
FIG. 8 is a flowchart of a method for detecting the position of a switching device in accordance with an illustrative embodiment.

Referring to FIG. 8, a method 200 for detecting the position of a switching device 32 will now be described. The method 200 comprises at step 202 receiving the reading of the current feedback $I_F$. Once the reading is received, the reading of the current feedback $I_F$ may be compared (step 204) to a predetermined threshold, such as the current command $I_C$ previously sent to the solenoid 34, the current feedback trip point $I_{TRIP}$, or the expected value of the current feedback $I_F$, as discussed above. The next step 206 is then to infer the position of the switching device 32 according to the result of the comparison. For example, in the case illustrated in FIG. 2a where a single resistor 42 may be engaged by the single position switch 32, if the current feedback $I_F$ is equal to the current command $I_C$, it may be determined that the switching device 32 is in position A. Once the position of the switching device 32 has been inferred, a new solenoid current command $I_C$ may be generated to control the energization level, and therefore the operation, of the solenoid 34 so that the switching device 32 may be placed in a desired position.

The above description is meant to be exemplary only, and one skilled in the art will recognize that changes may be made to the embodiments described without departing from the scope of the invention disclosed. Modifications which fall within the scope of the present invention will be apparent to those skilled in the art, in light of a review of this disclosure, and such modifications are intended to fall within the appended claims.

The invention claimed is:

1. A switching device position detection system comprising:
    a solenoid adapted to generate mechanical energy from an energizing current supplied thereto;
    a switching device coupled to the solenoid and adapted to be driven by the mechanical energy generated from the solenoid to move between a first position and at least one second position;
    at least one measuring element coupled to the switching device, the at least one measuring element adapted to be engaged by the switching device and to have a measuring current flowing therethrough when the switching device moves to the at least one second position; and
    a solenoid driver coupled to the solenoid to supply the energizing current to the solenoid, the solenoid driver coupled to the at least one measuring element to detect the measuring current and configured to identify a fault in the switching device when the energizing current has been supplied to the solenoid and the measuring current is not detected by the solenoid driver.

2. The system of claim 1, wherein the solenoid driver is adapted to update the energizing current for supply to the solenoid.

3. The system of claim 1, wherein the solenoid driver is adapted to receive a feedback current comprising a sum of the energizing current and the measuring current when the at least one measuring element has moved to the at least one second position, and compare the feedback current to a predetermined threshold to detect the measuring current.

4. The system of claim 3, wherein the predetermined threshold corresponds to the energizing current at a time $t=t_1$ preceding a time $t=t_2$ at which the switching device has moved to the at least one second position.

5. The system of claim 1, wherein the at least one measuring element comprises at least one resistor.

6. The system of claim 1, wherein the switching device is adapted to move between the first position and a plurality of successive second positions.

7. The system of claim 6, wherein the at least one measuring element comprises a first measuring element, the first measuring element adapted to be engaged by the switching device and to have a first measuring current flowing therethrough when the switching device is in the first position, and a plurality of second measuring elements each adapted to be successively engaged by the switching device and to have a second measuring current flowing therethrough when the switching device is in a corresponding one of the plurality of successive second positions.

8. The system of claim 7, wherein the second measuring current flowing through a first one of the plurality of second measuring elements is different from the first measuring current and from the second measuring current flowing through a second one of the plurality of second measuring elements.

9. The system of claim 1, wherein the switching device is adapted to move between a plurality of successive steady state positions and to pass through a transient position when moving between each pair of the plurality of successive steady state positions.

10. The system of claim 9, wherein the at least one measuring element comprises a plurality of measuring elements each adapted to be temporarily engaged by the switching device and have the measuring current flowing therethrough when the switching device passes through the transient position.

11. A switching device position detection method comprising:
   energizing a solenoid by supplying an energizing current from a solenoid driver coupled thereto, thereby actuating a switching device coupled to the solenoid to move between a first position and at least one second position when the solenoid generates mechanical energy in response to being energized;
   generating a measuring current through at least one measuring element coupled to the switching device when the switching device moves between the first position and the at least one second position;
   detecting the measuring current from the measuring element at the solenoid driver; and
   identifying a fault in the switching device when the energizing current has been supplied to the solenoid and the measuring current is not detected by the solenoid driver.

12. The method of claim 11, wherein detecting the measuring current comprises receiving a feedback current comprising a sum of the energizing current and the measuring current when the at least one measuring element has moved to the at least one second position, and comparing the feedback current to a predetermined threshold.

13. The method of claim 12, wherein comparing the feedback current to a predetermined threshold comprises comparing the feedback current to the energizing current at a time $t=t_1$ preceding a time $t=t_2$ at which the switching device has moved to the at least one second position.

14. The method of claim 11, further comprising updating the energizing current for supply to the solenoid.

15. The method of claim 11, wherein energizing the solenoid actuates the switching device to move between the first position and a plurality of successive second positions.

16. The method of claim 15, wherein generating a measuring current comprises generating the measuring current through a first measuring element coupled to the switching device when the switching device is in the first position and generating the measuring current through each one of a plurality of second measuring elements coupled to the switching device when the switching device is in a corresponding one of the plurality of successive second positions.

17. The method of claim 11, wherein energizing the solenoid actuates the switching device to move between a plurality of successive steady state positions and to pass through a transient position when moving between each pair of the plurality of successive steady state positions.

18. The method of claim 17, wherein generating a measuring current comprises generating the measuring current through each one of a plurality of measuring elements coupled to the switching device when the switching device passes through the transient position.

19. A switching device position detection system comprising:
   means for energizing a solenoid by supplying an energizing current from a solenoid driver coupled thereto, thereby actuating a switching device coupled to the solenoid to move between a first position and at least one second position when the solenoid generates mechanical energy in response to being energized;
   means for generating a measuring current through at least one measuring element coupled to the switching device when the switching device moves between the first position and the at least one second position; and
   means for detecting the measuring current from the measuring element at the solenoid driver; and
   means for identifying a fault in the switching device when the energizing current has been supplied to the solenoid and the measuring current is not detected by the solenoid driver.

\* \* \* \* \*